(12) United States Patent
Liu

(10) Patent No.: US 11,800,761 B2
(45) Date of Patent: *Oct. 24, 2023

(54) LED DISPLAY WITH PIXEL CIRCUITRY DISPOSED ON A SUBSTRATE BACKSIDE

(71) Applicant: V-Finity, Inc., Saratoga, CA (US)

(72) Inventor: Heng Liu, Sunnyvale, CA (US)

(73) Assignee: V-Finity, Inc., Saratoga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/931,322

(22) Filed: Sep. 12, 2022

(65) Prior Publication Data

US 2023/0006027 A1    Jan. 5, 2023

Related U.S. Application Data

(63) Continuation-in-part of application No. 17/240,776, filed on Apr. 26, 2021, now Pat. No. 11,476,320.
(Continued)

(51) Int. Cl.
| | |
|---|---|
| H10K 59/131 | (2023.01) |
| G09G 3/3233 | (2016.01) |
| H10K 77/10 | (2023.01) |
| H10K 59/12 | (2023.01) |
| H10K 71/00 | (2023.01) |
| G02F 1/1333 | (2006.01) |

(Continued)

(52) U.S. Cl.
CPC ......... *H10K 59/131* (2023.02); *G09G 3/3233* (2013.01); *H10K 71/00* (2023.02); *H10K 77/111* (2023.02); *G02F 1/1368* (2013.01); *G02F 1/13336* (2013.01); *G02F 2202/105* (2013.01); *G09G 2300/0842* (2013.01); *H10K 59/1201* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 5,851,411 | A | 12/1998 | An et al. |
| 5,965,916 | A | 10/1999 | Chen |

(Continued)

FOREIGN PATENT DOCUMENTS

| | | |
|---|---|---|
| WO | 9941788 A1 | 8/1999 |
| WO | 2021021406 A1 | 2/2021 |

OTHER PUBLICATIONS

"International Application Serial No. PCT/US2020/041239, International Search Report dated Oct. 8, 2020", 2 pgs.

(Continued)

*Primary Examiner* — Ashok Patel
(74) *Attorney, Agent, or Firm* — Schwegman Lundberg & Woessner, P.A.

(57) ABSTRACT

A display comprises a substrate (e.g., glass), a plurality of pixel circuits disposed on a back surface of the substrate, and a plurality of self-emitting devices disposed on a front surface of the substrate. The self-emitting devices are electrically connected to the plurality of pixel circuits by at least one electrically conductive via traveling through the substrate. Each pixel circuit comprises a first and a second transistor and a capacitor. The self-emitting devices may be LEDs or OLEDs for example.

10 Claims, 12 Drawing Sheets

Related U.S. Application Data which is a continuation-in-part of application No. 16/923,895, filed on Jul. 8, 2020, now abandoned.

(60) Provisional application No. 62/885,425, filed on Aug. 12, 2019, provisional application No. 62/881,634, filed on Aug. 1, 2019.

(51) Int. Cl.
 *G02F 1/1368* (2006.01)
 *H10K 102/00* (2023.01)

(56) References Cited

U.S. PATENT DOCUMENTS

| | | | |
|---|---|---|---|
| 6,476,783 B2 * | 11/2002 | Matthies | H10K 59/18 345/82 |
| 9,105,615 B1 | 8/2015 | Ghali | |
| 9,412,772 B1 | 8/2016 | Ghali | |
| 11,476,320 B2 | 10/2022 | Liu | |
| 2002/0050958 A1 * | 5/2002 | Matthies | H10K 50/858 345/55 |
| 2016/0197134 A1 | 7/2016 | Jung et al. | |
| 2019/0180692 A1 | 6/2019 | Fujii et al. | |
| 2019/0189729 A1 | 6/2019 | Zhang et al. | |
| 2020/0013842 A1 | 1/2020 | Lee et al. | |
| 2020/0365665 A1 * | 11/2020 | Choi | H10K 59/353 |
| 2020/0395403 A1 * | 12/2020 | Ahmed | G09F 9/33 |
| 2021/0033900 A1 | 2/2021 | Liu | |
| 2021/0249502 A1 | 8/2021 | Liu | |

OTHER PUBLICATIONS

"International Application Serial No. PCT/US2020/041239, Written Opinion dated Oct. 8, 2020", 5 pgs.

"U.S. Appl. No. 16/923,895, Restriction Requirement dated Apr. 2, 2021", 5 pgs.

"U.S. Appl. No. 16/923,895, Response filed Apr. 21, 2021 to Restriction Requirement dated Apr. 2, 2021", 4 pgs.

"U.S. Appl. No. 16/923,895, Non-Final Office Action dated May 3, 2021", 7 pgs.

"U.S. Appl. No. 16/923,895, Response filed May 12, 2021 to Non-Final Office Action dated May 3, 2021", 7 pgs.

"U.S. Appl. No. 16/923,895, Final Office Action dated Jul. 26, 2021", 10 pgs.

"International Application Serial No. PCT/US2020/041239, International Preliminary Report on Patentability dated Feb. 10, 2022", 7 pgs.

"U.S. Appl. No. 17/240,776, Non-Final Office Action dated May 26, 2022", 13 pgs.

"U.S. Appl. No. 17/240,776, Response filed Jun. 8, 2022 to Non-Final Office Action dated May 26, 2022", 7 pgs.

"U.S. Appl. No. 17/240,776, Notice of Allowance dated Jun. 27, 2022", 8 pgs.

* cited by examiner

LED DISPLAY WITH PIXEL CIRCUITRY DISPOSED ON A SUBSTRATE BACKSIDE

CROSS REFERENCE TO RELATED APPLICATIONS

This application is a continuation-in-part of and incorporates by reference U.S. patent application Ser. No. 17/240,776 filed Apr. 26, 2021, which is a continuation-in-part of and incorporates by reference U.S. patent application Ser. No. 16/923,895 filed Jun. 8, 2020, which claims priority to and incorporates by reference U.S. patent application Ser. No. 62/881,634 filed Aug. 1, 2019 and U.S. patent application Ser. No. 62/885,425 filed Aug. 12, 2019.

TECHNICAL FIELD

The present disclosure generally relates to flat panel displays and more particularly, but not exclusively, to providing a flat panel display with pixel circuitry mounted a backside of a glass substrate of the display.

BACKGROUND

Multiple smaller liquid crystal displays (LCD) and organic light-emitting diode (OLED) displays can be combined to form a larger display, especially when desired total display size exceeds 100 inches. This modular approach to form a large display is less expensive and less complex than generating a single display due to the sheer size of a large display. However, this modular approach leads to dark seams between each smaller display, which are visible to a viewer.

SUMMARY

A display comprises a substrate (e.g., glass), a plurality of pixel circuits disposed on a back surface of the substrate, and a plurality of self-emitting devices disposed on a front surface of the substrate. The self-emitting devices are electrically connected to the plurality of pixel circuits by at least one electrically conductive via traveling through the substrate. Each pixel circuit comprises a first and a second transistor and a capacitor. The self-emitting devices may be LEDs or OLEDs for example.

A method of manufacturing the display comprises: providing a substrate with pixel circuitry on a first surface, the pixel circuitry comprising a first and a second transistor and a capacitor; forming self-emitting device dies on a second surface of the substrate; creating a through hole via in the substrate between the self-emitting devices dies and the pixel circuitry; and forming electrical conductive material in the through hole via to connect the pixel circuitry to the self-emitting devices dies.

BRIEF DESCRIPTION OF THE DRAWINGS

To more easily identify the discussion of any particular element or act, the most significant digit or digits in a reference number refer to the figure ("FIG.") number in which that element or act is first introduced.

DETAILED DESCRIPTION

The description that follows includes systems, methods, techniques, that embody illustrative embodiments of the disclosure. In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

Figure 1:
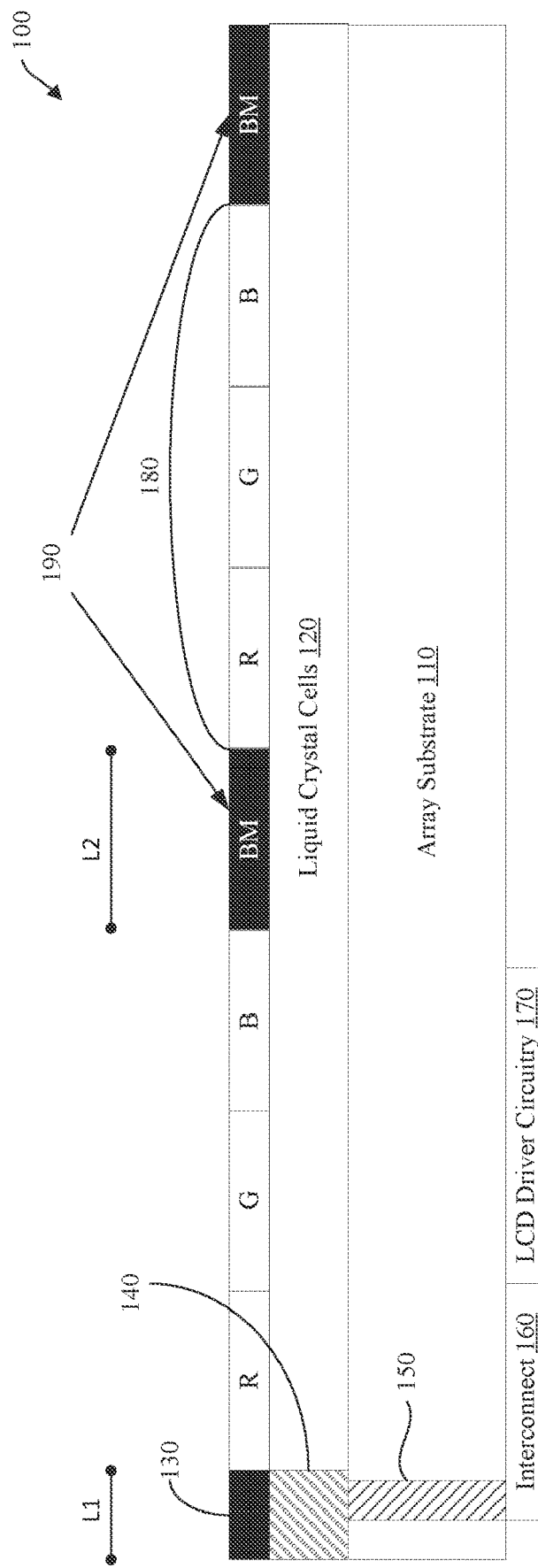
FIG. 1 depicts a cross section of a liquid crystal display according to an embodiment.

FIG. 1 depicts a cross section of a liquid crystal display 100 according to an embodiment. The liquid crystal display 100 comprises a first layer 110 comprising an array substrate (including thin film transistors (TFTs) not shown); a second layer 120 of liquid crystal cells having a sealant 140 at an edge of the second layer 120; a third layer of color filters comprising sets 180 of filters (e.g., red, green and blue) with first non-emitting spaces 190 between each set 180. An edge of the third layer has a second non-emitting space 130 having a length L1 less than a length L2 of one of the first non-emitting spaces 190. In an embodiment, the first and second non-emitting spaces 190 and 130 comprise black matrix. The sealant 140 and the second non-emitting space 130 have an approximate equal length (e.g., +/−10%). In another embodiment, the sealant length is larger than L1. At a maximum, sealant length would be ½ of L2. Note for ease of description, other elements of the LCD 100 known to one of ordinary skill in art, e.g., a polarizer, films, cover glass, etc. are not shown or described.

In an embodiment the second non-emitting space 130 has a length L1 of approximately (e.g., +/−10%) half of a length L2 of one of the first non-emitting spaces 190. In an embodiment, L1 and be approximately 50-400 um and L2 approximately 100-800 um. For example, for a 4 K 150", the pixel pitch is 0.837 mm (837 um). L1 can be 200 um, L2 can be 400 um; or with larger emitting area L1: 100 um, L2 200 um. For a 4 K 100", the pixel pitch is 0.558 mm (558 um), L1 can be 150 um, L2 can be 300 um. In an embodiment, the emitting area is at least about 25% in a pixel, for example, 50%.

The LCD 100 also comprises a though hole conductive via 150 in the first layer 110 electrically connected to LCD driver circuitry 170 on a first surface of the first layer 110 and the thin film transistors on a second surface of the first layer 110. The LCD driver circuitry 170 can be connected to the via 150 via an interconnect 160 also mounted on the first surface of the first layer 110 or located elsewhere and connect to the via 150 by flexible cable.

The via 150 can be conductor-filled or metal coated on an inside surface and bring the circuit connection to the back (first surface) of the array substrate 110. A filler in the via 150 can be metal, Ag-epoxy or other electrical conducting materials. The via 150 can be made by laser drilling, wet or dry etching, or combination. The via may be located underneath first and/or second non-emitting spaces 190 and 130 so as to not block light at sets 180. Note that while a single via 150 is illustrated, the LCD 100 may have multiple vias (e.g., one via per pixel). The via can be filled by dispensing, printing, electro-plating, vapor deposition, photolithography, direct writing and spraying of filler materials.

Interconnection circuitry 160 can be made by photolithography like semiconductor IC process or printed circuit board process. For example, the interconnect can be made by dispensing, printing, electro-plating, vapor deposition, photolithography, direct writing and masked spraying of conductive materials. Electronic components can be bonded to the printed circuit glass. Sealant structure 140 can be made by dispensing, screen printing, silk printing, photolithographic printing, etc. The Array substrate 110 can be glass, polymer, ceramic, silicon, etc.

Figure 4A:
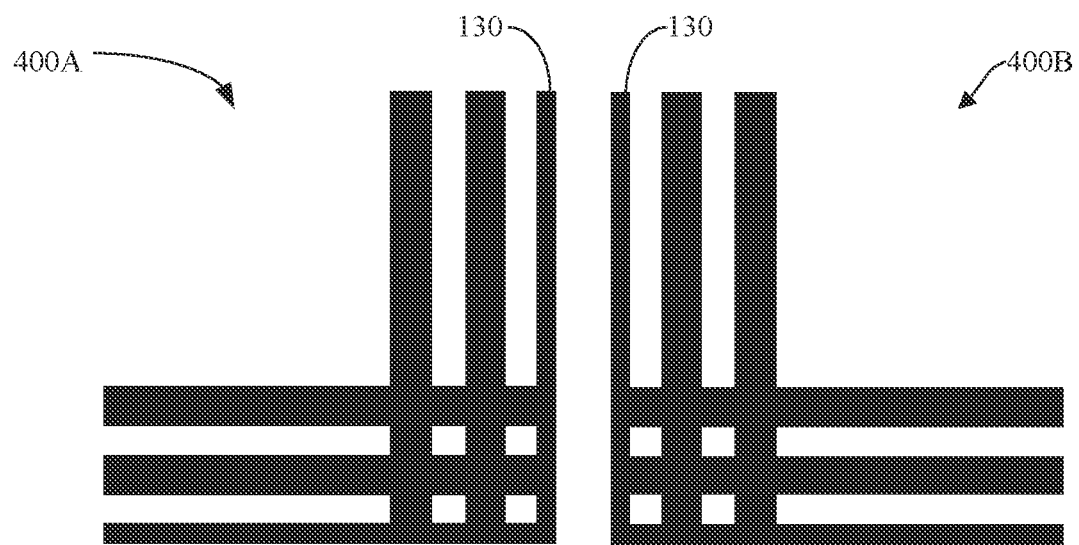
FIGS. 4A and 4B depict a plan view of joining of two displays to form a larger display.
Figure 4B:
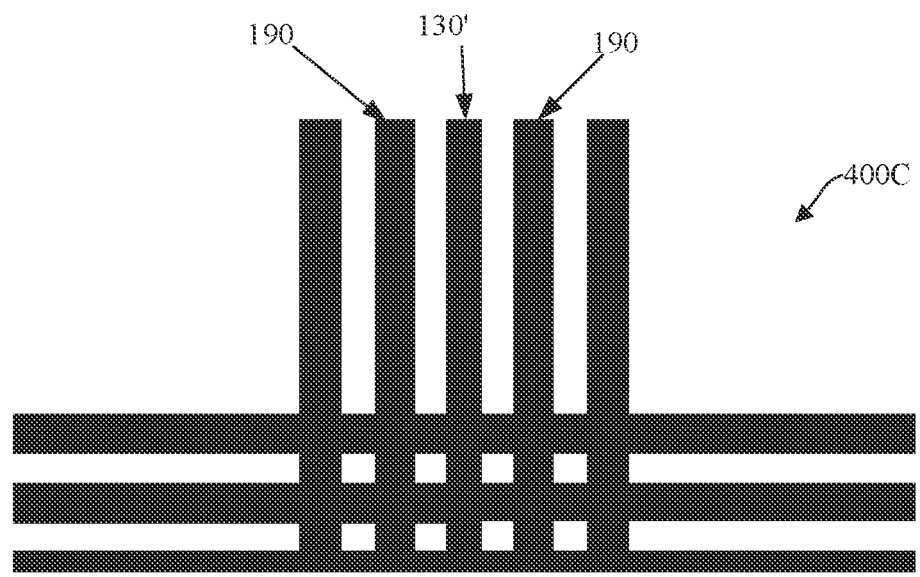

In an embodiment, each display 100 of a video wall (multi-panel display) can have a number of pixels needed to achieve final 4 k resolution over an entire video wall comprising a plurality of displays 100. If the module 100 has a very high pixel resolution, the non-emitting space 190 is very small. For example a 55" 2 K LCD module the non-emitting space 190 between pixel is only about 100 um (pixel pitch is about 600 um). In an embodiment, a module with the final display resolution, say 4 k 165" (equivalent to 3×3 LCD wall using 55" module), the pixel pitch of each module 100 need only be 900 um. The non-emitting space 130 at the edge can be made to 200 um making a seamless connection possible as shown in FIGS. 4A and 4B.

Figure 2:
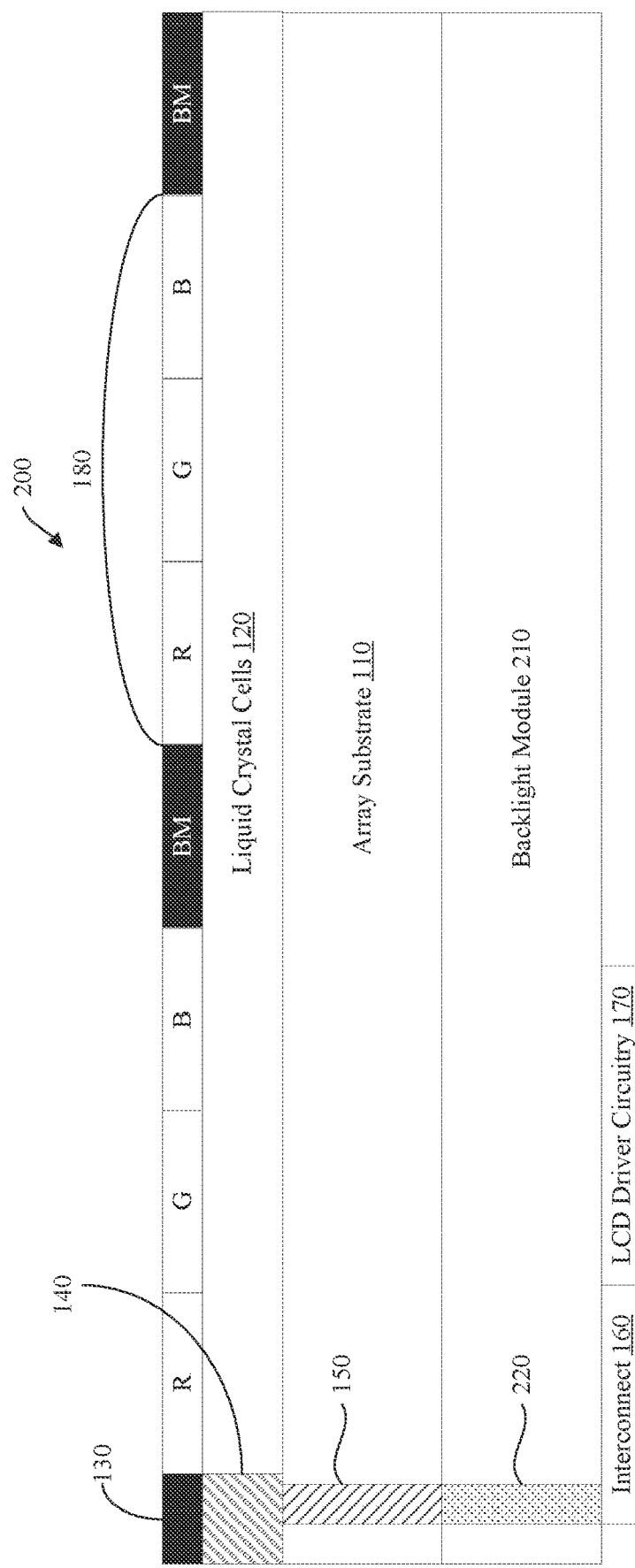
FIG. 2 depicts a cross section of an LCD with backlight according to an embodiment.

FIG. 2 depicts a cross section of an LCD 200 with a backlight 210 according to an embodiment. The LCD 200 is substantially similar to the LCD 100 except it includes a backlight module 210 on the first surface of the first layer 110 and accordingly, the interconnect 160 and LCD driver circuitry are mounted on a back surface of the backlight module 210. The module 210 also includes an interface contact 220 between the via 150 and the interconnect 160.

The backlight module 210 can be a printed circuit board (PCB) with OLED or LED (light emitting diode) mounted on the top and interface contacts to the via 150 in the array substrate 110. The PCB material can be FR4, BT, polymer or glass, etc. Note for ease of description, other elements of the LCD 100 known to one of ordinary skill in art, e.g., a polarizer, films, cover glass, etc. are not shown or described.

The backlight module 210 can be made into the same panel size as the first layer 110 or smaller and can be bonded to the first layer 110 by solder joint, eutectic bonding, or ACF/ACP (anisotropic conductive film or paste) bonding.

In an embodiment, the backlight module 210 can also be an LED or OLED display with self-emitting pixels.

Figure 3:
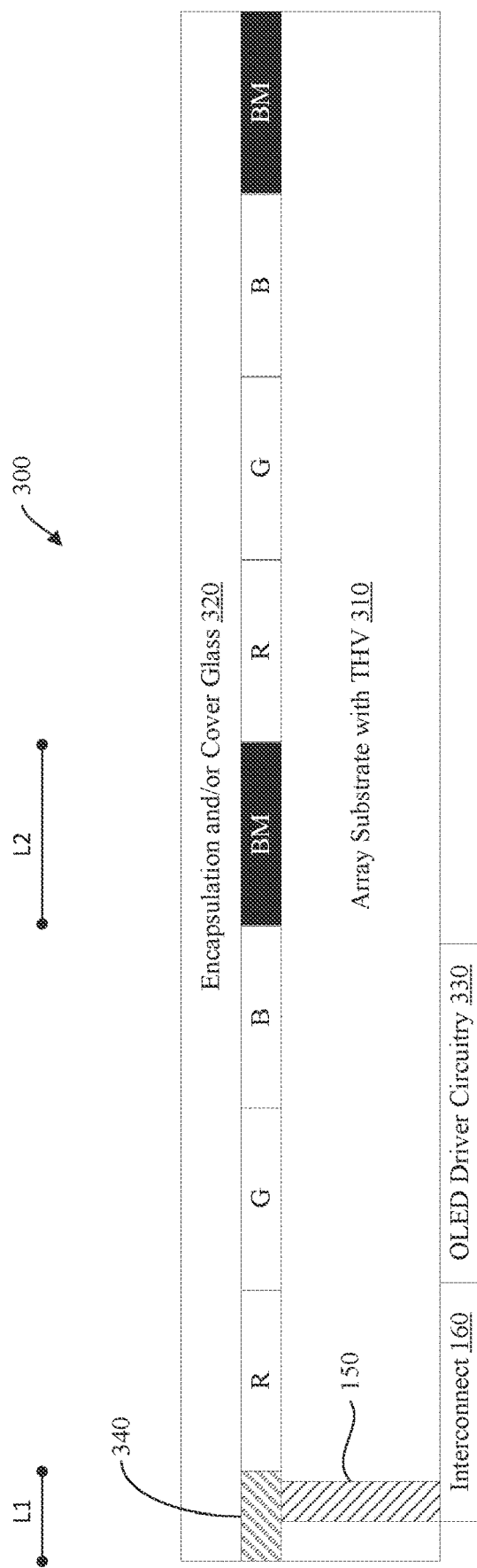
FIG. 3 depicts a cross section of an OLED display according to an embodiment.

FIG. 3 depicts a cross section of an OLED display 300 according to an embodiment. The OLED display 300, comprises a first layer comprising an array substrate 310, which can be similar to the array substrate layer 110; a second layer of OLEDs comprising sets of OLEDs (marked as R, G, and B) with non-emitting spaces between each set (marked as BM for Black Matrix but it can be another insulator with some transparency), the second layer further has an edge non-emitting space 340 at an edge of the second layer; and a third layer 320 of glass or polymer type encapsulant to prevent air or moisture contact to OLED layer. The edge non-emitting space 140 has a length L1 less than a length L2 of one of the inside non-emitting spaces. The space 340 can comprise same or similar material to the non-emitting spaces labelled BM.

The OLED display 300 can also further comprises a conductive via 150 connecting an interconnect 160 to the second layer. The interconnect 160 is located at a first surface of the first layer 310 and the via 150 can be located anywhere of the array substrate 310 since it does not block any light emitting from the OLED itself. The OLED display also includes OLED driver circuitry 330 coupled to the interconnect 150, and can be located elsewhere and connect to the via 150 by flexible cable. Note for ease of description, components of display 300 known to one of ordinary skill in the art are not illustrated, e.g. cathode and anode.

The conductive via 150 is through the first layer 310.

The edge non-emitting space 140 length L1 can be reduced to approximately (+/−10%) half the length L2 of the inside non-emitting space so that when two modules are connected the combined length is the same as the inside non-emitting space length L2. The via 150 (also referred to as a through hole via—THV) brings a circuit connection to the back of the array substrate 310.

The array substrate 310 may be very thin material and there can be a more rigid substrate such as PCB inserted between the array substrate 310 and the OLED driver circuitry 330.

FIGS. 4A and 4B depict a plan view of joining of two displays (also referred to as panels) 400A and 400B to form a larger display 400C. Edges of the panels 400A and 400B join together so that a combined edge is approximately equal in length to other non-emitting areas within the combined display 400C. The panels 400A and 400B can be the displays 100, 200, and/or 300. When the panels 400 A and B are disposed adjacent each other a combined length of the second non-emitting space 130' of the first and second panels is approximately equal to the length of one of the first non-emitting spaces 190. When the panels 400A and B comprise the OLED displays 300, a combined length of edge non-emitting space 140 on respective edges is equal to the length of one of the inside non-emitting spaces L2. Note that in an embodiment, non-emitting spaces 130 at edges of each panel can be of different lengths as long as when combined total length is approximately equal to the length of non-emitting spaces 190. That is, L1 can vary among panels as long as when joined, the two L1s are equal approximately (+/−10%) to L2. For example, a first L1 when may be ¼ length of L2 and a second L1 is ¾ length of L2.

Figure 5:
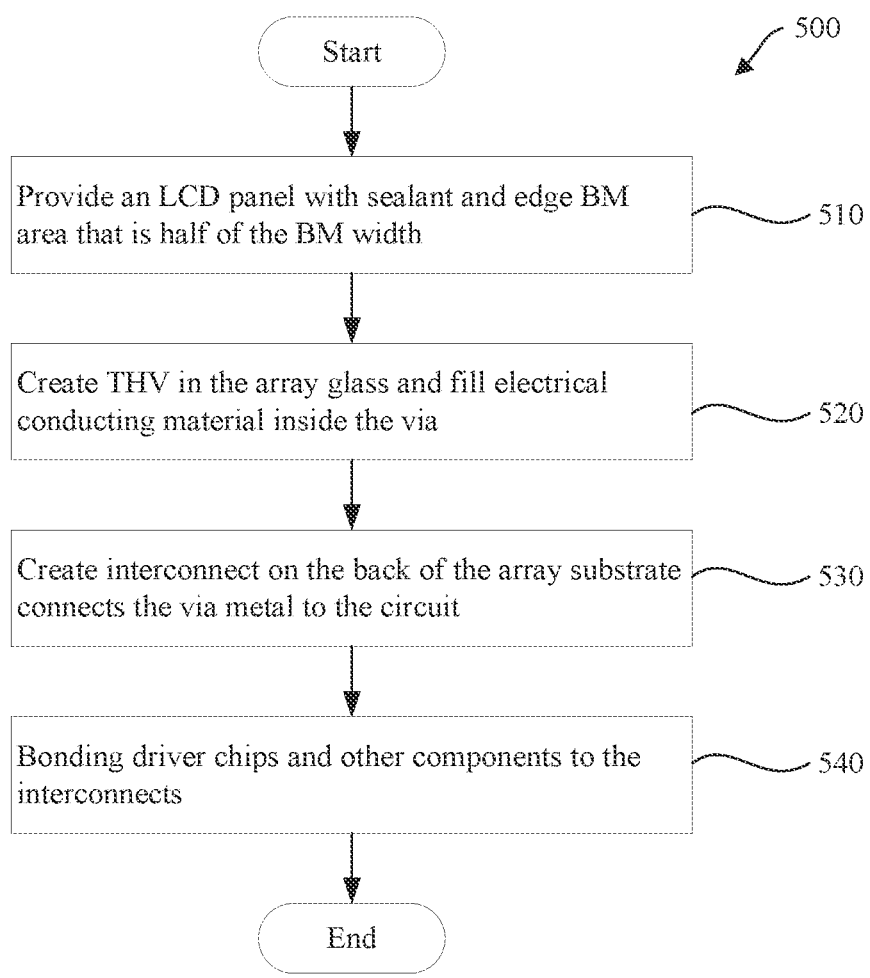
FIG. 5 depicts a flowchart of a method of manufacturing an LCD according to an embodiment.

FIG. 5 depicts a flowchart of a method 500 of manufacturing an LCD 100 or 200 according to an embodiment. The method 500 comprises providing (510) a first LCD panel, such as panel 100 or 200. The sealant 140 and non-emitting space 130 (i.e., edge area) have a length L1 less than (e.g., approximately half) of the non-emitting space 190 length L2. Creating (520) a conductive via 150 in the array substrate 110 and filling electrical conducting material inside the via 150 or metal coating an inside surface of the via 150. Creating (530) an interconnect 160 on a first surface of the array substrate 110 and connecting the via to thin film transistors on a second surface of the array substrate 110. Bonding (540) LCD driver circuitry 170 to the interconnect 150. The method 500 may further comprise positioning a backlight module 210 on a surface of the first layer 110 and an interface contact 220 between the via 150 and the interconnect 160.

Figure 6:
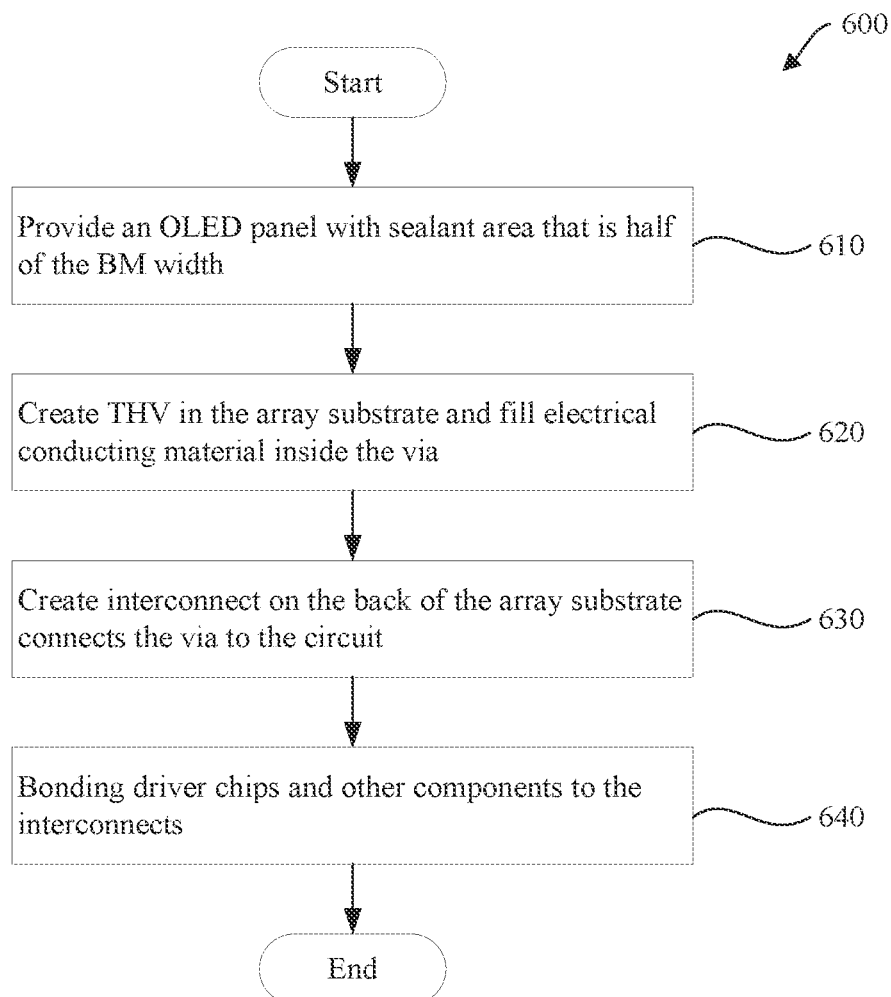
FIG. 6 depicts a flowchart of a method of manufacturing an OLED display according to an embodiment.

FIG. 6 depicts a flowchart of a method 600 of manufacturing an OLED display 300 according to an embodiment. The method 600 comprises providing (610) a first OLED panel where the edge non-emitting space 140 length L1 is less than an inside non-emitting space length L2 (e.g., approximately half the length); creating (620) a conductive via in the first layer and filling the via with electrical conducting material or metal coating an inside surface; creating (630) an interconnect on a first surface of the first layer connected to the via; and bonding (640) OLED driver circuitry to the interconnect. The via may be located anywhere of the array substrate 310 since they do not block light at any emitting space.

Figure 7:
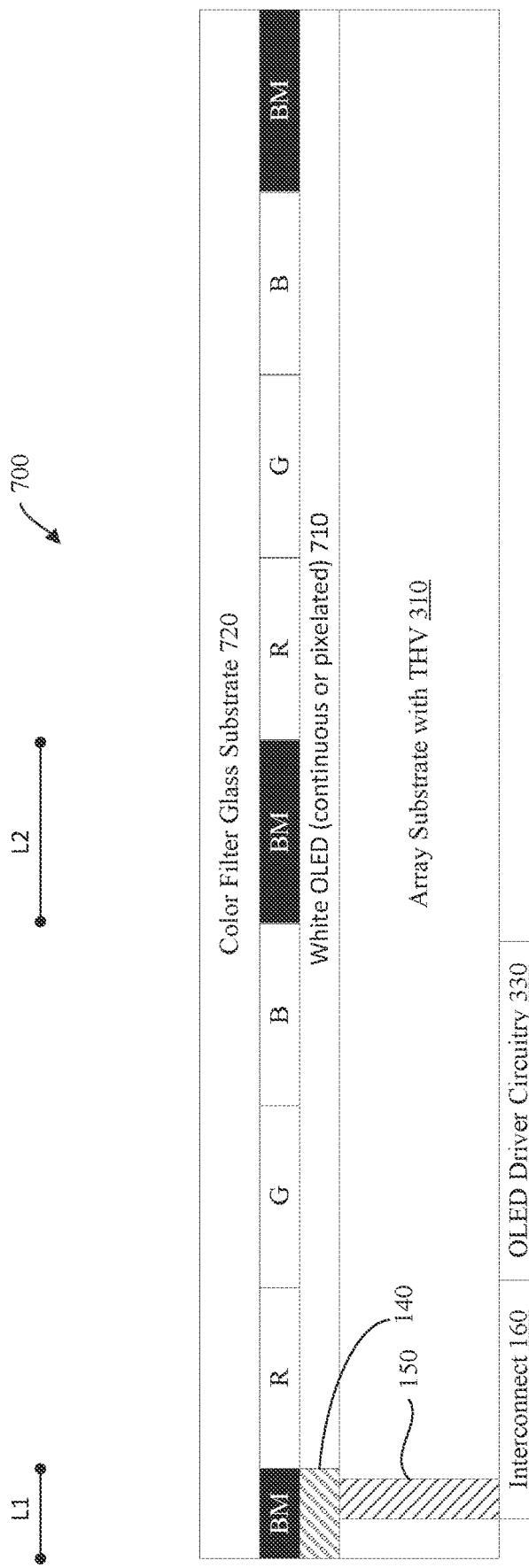
FIG. 7 depicts a cross section of an OLED display according to an embodiment.

FIG. 7 depicts a cross section of an OLED display 700 according to an embodiment. The OLED display 700 is similar to the OLED display 300 and includes a white OLED 710 can be a continuous layer while the TFT driving circuit in each pixel light up only the portion of OLED electrically connected to it and other area will not light up since OLED has very large lateral resistance that electrical current does not flow in that direction.

Figure 8:
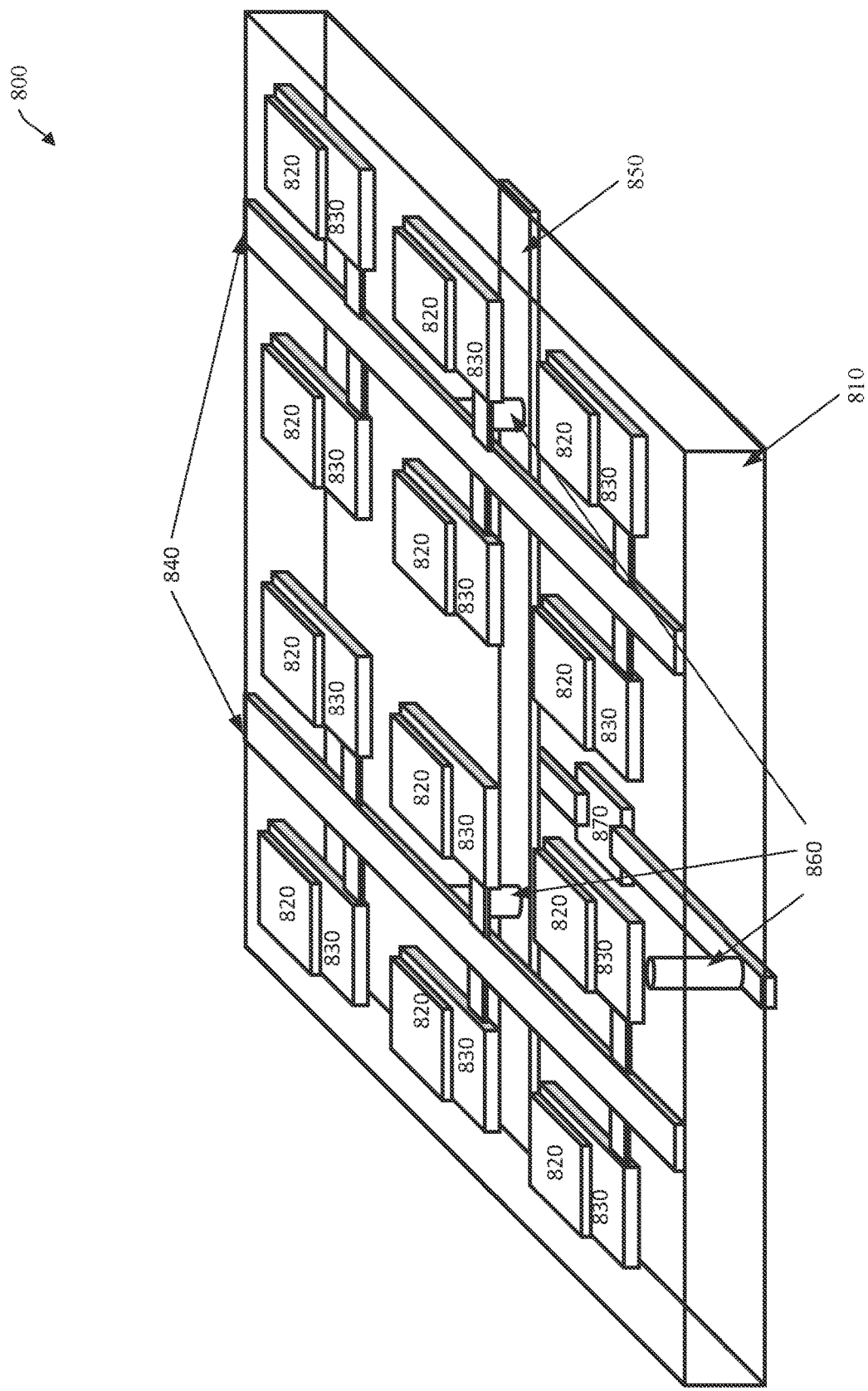
FIG. 8 depicts a light emitting diode (LED) display according to an embodiment.

FIG. 8 depicts a light emitting diode (LED) display 800 according to an embodiment. The display 800 includes a substrate 810, such as a thin-film-transistor substrate or other substrate (e.g., glass or flexible material such as polyimide (PI)), having a plurality of LEDs 820 electrically connected to TFT circuits 830. The LEDs 820 may also be any self-emitting devices such as OLED and electroluminescent devices. The circuits 830 are powered by one or more power lines 840. TFT circuits are designed to operate in standard active matrix (AM) mode. Data and Select/Scan lines in such a standard active matrix circuitry are not shown. In standard passive matrix circuit design, the power lines 840 are one of the data and select/scan lines. On a back surface or other location, an interconnect 850 distributes electrical power to the power lines 840 through vias 860. While three vias are shown in FIG. 8, those of ordinary skill in the art will realize any number of vias may be used. A power/driver integrated circuit (IC) 870 sends commands to the circuits 830 also through the vias 860 and interconnects 850 (of which there may be more than one). The IC 870 may be mounted to a rear surface of the substrate 810 or otherwise positioned so it can be communicatively coupled to the interconnect 850.

The display 800 may include other components not shown such as non-emitting areas (e.g., black matrix), e.g., between LED pixels, edge sealant, data lines, select/scan lines, and other components, such as those shown in the displays above. Further, an edge of the display 800 (or panel) may have a non-emitting space at one or more edges having a length less than a length of a non-emitting space within the panel such that multiple panels may be aligned together with a total non-emitting space at two edges approximately equal to a non-emitting space within the panel, such as between pixels.

In one aspect, the vias 860 are located at least one-pixel distance from an edge of the display 800. This is because the vias 860 can be created some distance away from the edge of the substrate (glass) to prevent stress that may cause breakage. Additionally, the vias 860 may not be able to made small enough to fit in the less than ½ of the non-emitting pixel gap at the edge (but can be made less than 1 non-emitting pixel gap so it can fit between the pixel—larger via dimension are easier to make and easier to fill in conductive material).

This aspect also applies to the OLED display 300 and the LCD display 100.

Figure 9:
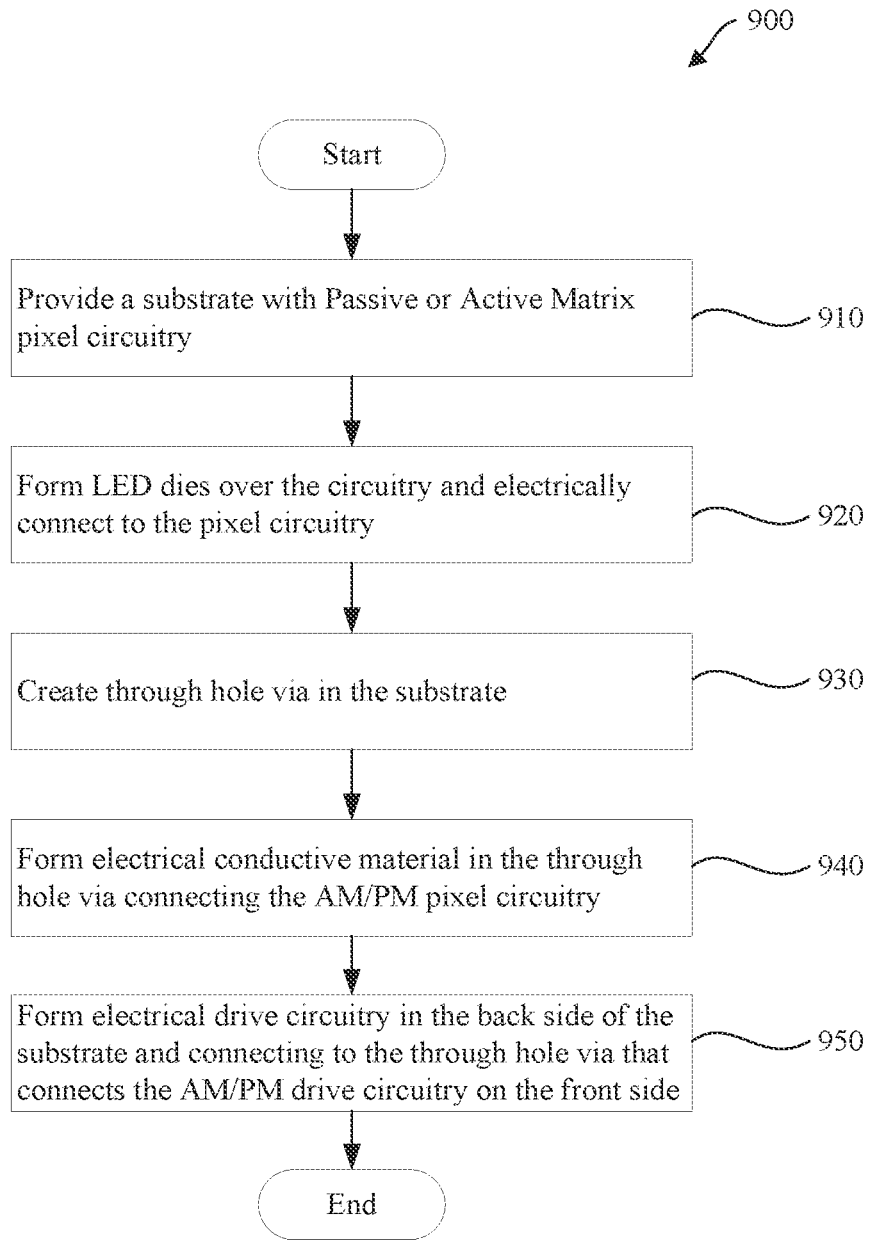
FIG. 9 depicts a flowchart of a method of manufacturing a LED display according to an embodiment.

FIG. 9 depicts a flowchart of a method 900 of manufacturing a LED display 800 according to an embodiment. The method 900 comprises: providing (910) a substrate with Passive or Active Matrix (PM or AM) pixel circuitry; form (920) LED dies over the circuitry and electrically connect to the pixel circuitry; creating (930) through hole via in the substrate, including glass, if any; forming (940) electrical conductive material in the through hole via connecting the AM/PM pixel circuitry; and forming electrical drive circuitry in the back side or other location of the substrate and connecting to the through hole via that connects the AM/PM drive circuitry on the front side. Optionally, protecting the circuitry built on the substrate prior to the next process step such as via making to prevent damaging the circuitry.

Figure 10:
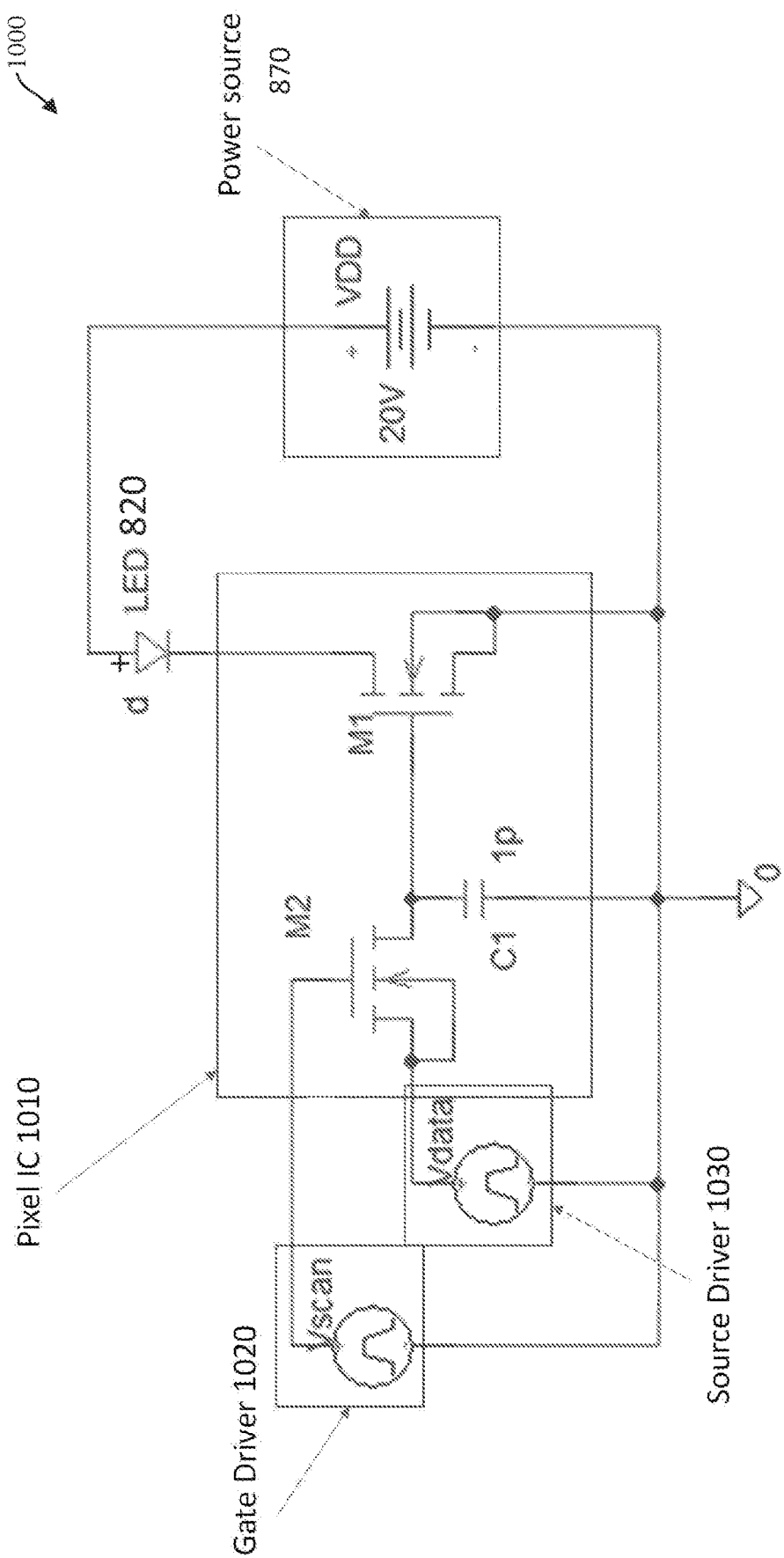
FIG. 10 depicts a diagram of a sub pixel circuit.

FIG. 10 depicts a diagram of a sub pixel circuit 1010 in an active matrix circuit 1000. The circuit 1000 comprises the sub pixel circuit 1010, (which may be substantially similar to the circuit 830) which in turn comprises transistors M1 and M2 and a capacitor C1. The circuit 1000 further includes a single-color LED 820 with a negative side coupled to the transistor M1 and a positive side coupled to the power source 870, which is connected ground. Note that the LED may be any self-emitting device. The transistor M2 is coupled to a source driver 1030 and a gate driver 1020. The capacitor C1 is coupled to ground and between the transistors M1 and M2.

The sub pixel circuit 1010 may comprise polycrystalline silicon (e.g., low-temperature polycrystalline silicon (LTPS)) or amorphous silicon deposited on glass. Each pixel of a display, such as the displays 100, 300, 800 may include these sub pixel circuits, which are substantially identical except for that the LEDs may be different colors. Note there may be, for example, 3 sub pixel circuits for each pixel using R, G, B LEDs.

Another approach is using single crystal silicon (semiconductor wafer) to create the sub pixel circuit 1010 that can be mounted onto glass or other substrate with an LED. The IC can run much faster, handle higher current, and so can drive the LED much brighter compared to polycrystalline or amorphous silicon. However, single crystal silicon is affected by light (e.g., from the LEDs) changing its properties such as electron mobility causing the transistors M1 and M2 not to operate at the intended operating point. Accordingly, by placing the sub pixel circuit 1010 on the backside of the panel, as discussed in conjunction with FIG. 11, the circuit 1010 can be blocked from light emitted by the LEDs (e.g., by painting the backside of the glass black or otherwise making it opaque). Otherwise, packaging of the circuit 1010 if on the frontside would be expensive (perhaps more than the cost of the circuit 1010 itself).

Figure 11:
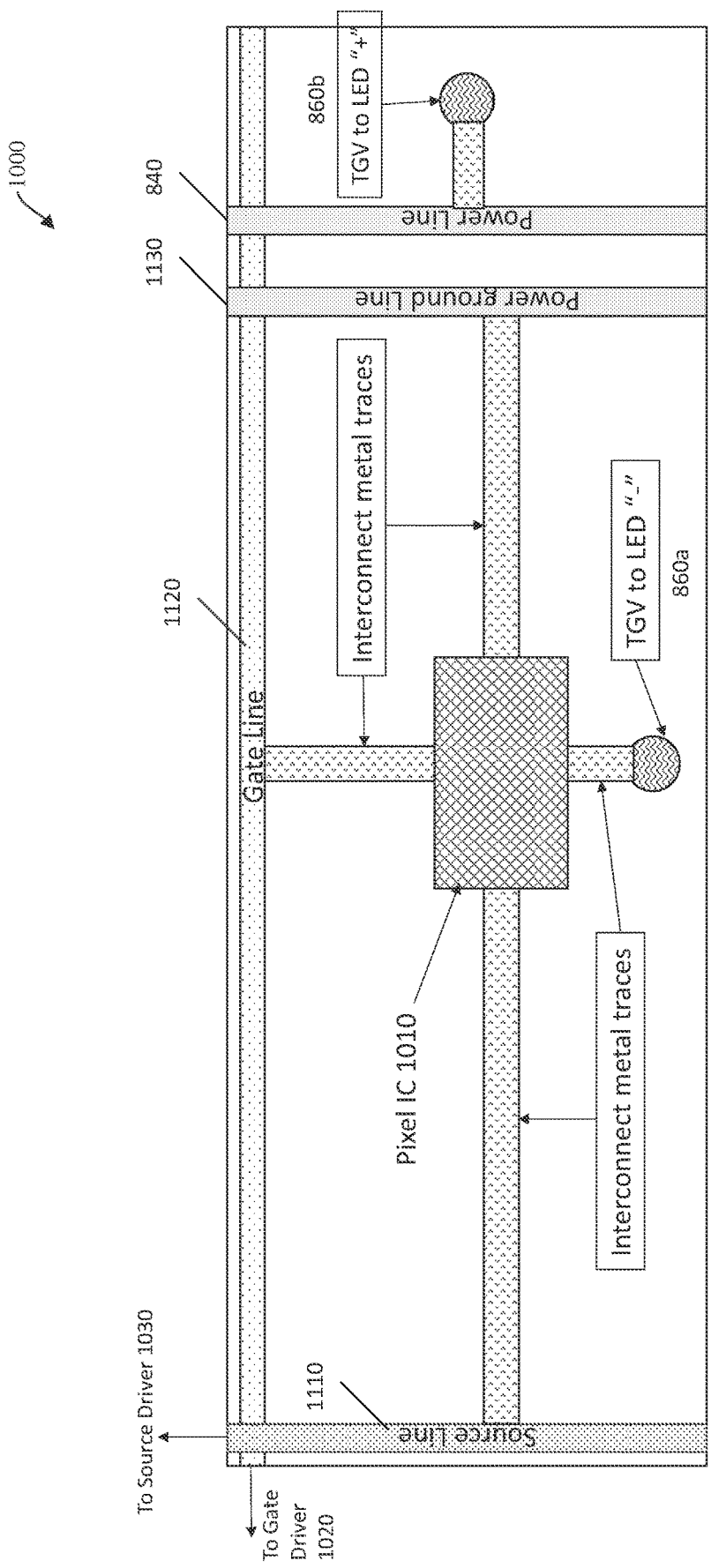
FIG. 11 depicts a backside view of a panel having the sub pixel circuit laid out thereon.

FIG. 11 depicts a backside view of a panel having the circuit 1000 laid out thereon. The backside of a display panel having the circuit 1000 is a surface opposing a frontside having the light emitters. Vias enable the pixel circuitry (e.g., sub pixel circuit 1010) to be placed on the backside with electrical connection to light emitters (e.g., LEDs). For each sub pixel circuit 1010, there is a source line 1110 and a gate line 1120 passing through it that is connected to the circuit 1010 via interconnect metal traces. Further, there is a powerline 840 passing through it as well as a power ground line 1130. The source line 1110 connects to the source driver 1030. The gate line 1120 is connected to the gate driver 1020. The source driver 1030 and the gate driver 1020 may control a plurality of pixels.

Figure 12:
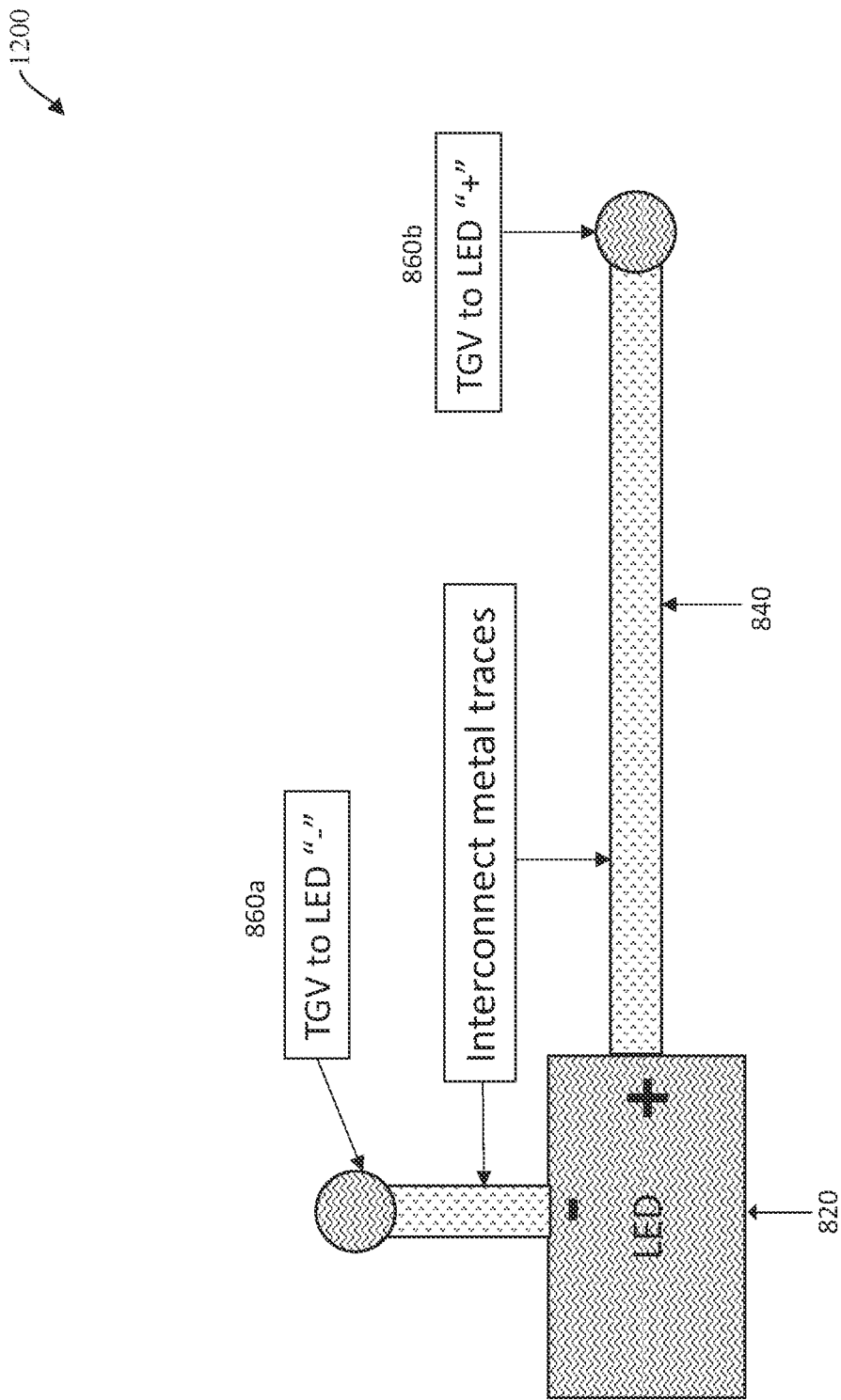
FIG. 12 depicts a frontside view of a panel having the circuit laid out thereon

FIG. 12 depicts a frontside view of a panel having the circuit 1000 laid out thereon. The frontside of the panel hosts the LED of FIG. 10 while the sub pixel circuit is connected to the LED 820 through vias 860*a* and 860*b* on the backside of the panel. The powerline 840 is fed power from the backside interconnect 850 through the via 860*b* (see via 860 in FIG. 8, which is substantially similar to the via 860*b*).

The following examples describe various embodiments of methods, machine-readable media, and systems (e.g., machines, devices, or other apparatus) discussed herein.

1. A display, comprising:
a substrate;
a plurality of pixel circuits disposed on a back surface of the substrate, each pixel circuit comprising a first and a second transistor and a capacitor; and
a plurality of self-emitting devices disposed on a front surface of the substrate and electrically connected to the plurality of pixel circuits by at least one electrically conductive via traveling through the substrate.

2. The display of example 1, wherein each pixel circuit is made of single crystal silicon.
3. The display of any of the preceding examples, wherein the substrate is opaque.
4. The display of any of the preceding examples, wherein the front or back surface is painted opaque.
5. The display of any of the preceding examples, wherein each pixel circuit is made of polycrystalline or amorphous silicon.
6. The display of any of the preceding examples, wherein the at least one via are at least one-pixel distance from an edge of the display.
7. The display of any of the preceding examples, wherein a source line, a power line and a power ground line are disposed on the back surface of the substrate.
8. The display of any of the preceding examples, further comprising a power line disposed on the back surface of the substrate and electrically connected to the plurality of light emitting diodes by a second at least one electrically conductive via traveling through the substrate.
9. The display of any of the preceding examples, wherein the first transistor is coupled to one of the plurality of self-emitting devices and the second transistor is coupled to a gate driver and a source driver disposed on the back surface of the substrate.
10. The display of any of the preceding examples, wherein each pixel of the display comprises a set of sub pixel circuits, each having a different color light-emitting device.
11. The display of any of the preceding examples, wherein the self-emitting devices include light-emitting diodes or organic light-emitting diodes.
12. The display of any of the preceding examples, wherein the substrate is glass, flexible substrate or polyimide.
13. A method of manufacturing a display, comprising:
providing a substrate with pixel circuitry on a first surface, the pixel circuitry comprising a first and a second transistor and a capacitor;
forming self-emitting device dies on a second surface of the substrate;
creating a through hole via in the substrate between the self-emitting devices dies and the pixel circuitry; and
forming electrical conductive material in the through hole via to connect the pixel circuitry to the self-emitting devices dies.
14. The method of example 13, wherein the pixel circuitry is made of single crystal silicon.
15. The method of any of the preceding examples, wherein the substrate is opaque.
16. The method of any of the preceding examples, wherein the first or second surface is painted opaque.
17. The method of any of the preceding examples, wherein the pixel circuitry is made of polycrystalline or amorphous silicon.
18. The method of any of the preceding examples, wherein the through hole via is at least one-pixel distance from an edge of the display.
19. The method of any of the preceding examples, further comprising disposing a source line, a power line and a power ground line on the first surface of the substrate.
20. The method of any of the preceding examples, further comprising disposing a power line on the first surface of the substrate and electrically connecting the power line to the self-emitting devices by an electrically conductive via traveling through the substrate.
21. The method of any of the preceding examples, wherein the first transistor is coupled to one of the self-emitting devices and the method further comprises disposing a gate driver and a source on the first surface of the substrate coupled to the second transistor.
22. The method of any of the preceding examples, wherein each pixel of the display comprises a set of sub pixel circuits, each having a different color self-emitting device.

Although the subject matter has been described with reference to specific example embodiments, it will be evident that various modifications and changes may be made to these embodiments without departing from the broader scope of the disclosed subject matter. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Description, therefore, is not to be taken in a limiting sense, and the scope of various embodiments is defined only by any appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A display, comprising:
at least one electrically conductive via;
a glass substrate;
a plurality of pixel circuits disposed on a back surface of the substrate, each pixel circuit comprising a first transistor, a second transistor and a capacitor, each pixel circuit made of single crystal silicon; and a plurality of self-emitting devices disposed on a front surface of the substrate and electrically connected to the plurality of pixel circuits by the at least one electrically conductive via traveling through the glass substrate.

2. The display of claim 1, wherein the substrate is opaque.

3. The display of claim 2, wherein the front or back surface is painted opaque.

4. The display of claim 1, wherein the at least one via are at least one-pixel distance from an edge of the display.

5. The display of claim 1, further comprising a source line, a power line and a power ground line disposed on the back surface of the substrate.

6. The display of claim 1, further comprising a power line disposed on the back surface of the substrate and electrically connected to the plurality of self-emitting devices by a second at least one electrically conductive via traveling through the substrate.

7. The display of claim 1, further comprising a gate driver and a source driver, wherein the first transistor is coupled to one of the plurality of self-emitting devices and the second transistor is coupled to the gate driver and the source driver disposed on the back surface of the substrate.

8. The display of claim 1, wherein each pixel of the display comprises a set of sub pixel circuits, each having a different color light-emitting device.

9. The display of claim 1, wherein the self-emitting devices include light-emitting diodes or organic light-emitting diodes.

10. The display of claim 1, wherein the substrate is glass, flexible substrate or polyimide.

* * * * *